US 8,343,366 B2

(12) United States Patent
Hong et al.

(10) Patent No.: US 8,343,366 B2
(45) Date of Patent: *Jan. 1, 2013

(54) FABRICATING A GRAPHENE NANO-DEVICE

(75) Inventors: Seunghun Hong, Seoul (KR); Joohyung Lee, Seoul (KR); Tae Hyun Kim, Seoul (KR)

(73) Assignee: SNU R&DB Foundation, Seoul (KR)

( * ) Notice: Subject to any disclaimer, the term of this patent is extended or adjusted under 35 U.S.C. 154(b) by 853 days.

This patent is subject to a terminal disclaimer.

(21) Appl. No.: 12/211,006

(22) Filed: Sep. 15, 2008

(65) Prior Publication Data

US 2010/0032409 A1 Feb. 11, 2010

(30) Foreign Application Priority Data

Aug. 5, 2008 (KR) .................. 10-2008-0076585

(51) Int. Cl.
B44C 1/22 (2006.01)
(52) U.S. Cl. ............ 216/41; 216/83; 977/932; 977/938; 250/492.2; 250/492.3
(58) Field of Classification Search ............ 216/41, 216/83; 977/932, 938; 250/492.2, 492.3
See application file for complete search history.

(56) References Cited

U.S. PATENT DOCUMENTS

| 2007/0287011 A1 | 12/2007 | DeHeer | |
|---|---|---|---|
| 2010/0025660 A1* | 2/2010 | Jain et al. | 257/24 |
| 2010/0035186 A1* | 2/2010 | Hong et al. | 430/311 |
| 2010/0320437 A1* | 12/2010 | Gordon et al. | 257/9 |

FOREIGN PATENT DOCUMENTS

| JP | 2002-075960 A | 3/2002 |
| JP | 2005-347378 A | 12/2005 |
| JP | 2007-158117 A | 6/2007 |
| JP | 2007-158120 A | 6/2007 |
| JP | 2009-164432 | 7/2009 |
| KR | 10-2009-0129298 A | 12/2009 |

OTHER PUBLICATIONS

Chen et al., "Graphene nano-ribbon electronics," *Physica E* 40:228-232 (2007).
Lemme et al., "Mobility in graphene double gate effect transistors," *Solid-State Electronics* 52:514-518 (online Feb. 2008).
Xuan et al., "Atomic-layer-deposited nanostructures for graphene-based nanoelectronics," *Appl. Phys. Lett.* 92:13-101 (online Jan. 2008).
English translation of Office Action dated Jul. 6, 2010 from German Patent Application No. 10 2008 060 644.8-54.
Notice of Allowance in KR Patent Appln. No. 10-2008-0076585.
Myung, S., et al., "Large-Scale "Surface-Programmed Assembly" of Pristine Vanadium Oxide Nanowire-Based Devices," Advanced Materials, 2005, Volume: 17, Issue: 19, pp: 2361-2364.

* cited by examiner

*Primary Examiner* — Shamim Ahmed
(74) *Attorney, Agent, or Firm* — Knobbe, Martens, Olson & Bear, LLP

(57) ABSTRACT

Nanoscale graphene structure fabrication techniques are provided. An oxide nanowire useful as a mask is formed on a graphene layer and then ion beam etching is performed. A nanoscale graphene structure is fabricated by removing a remaining oxide nanowire after the ion beam etching.

25 Claims, 6 Drawing Sheets

FABRICATING A GRAPHENE NANO-DEVICE

TECHNICAL FIELD

The described technology relates generally to fabricating a graphene nano-device.

BACKGROUND

Graphene shows stable characteristics and high electric mobility, and has accumulated considerable interest as a material for use in next generation semiconductor devices. However, in order to show semiconductor characteristics, the graphene is typically required to be formed as a channel having a nanoscale line width, since the graphene basically has a metallic characteristic.

For example, it is currently understood that the graphene is required to have a line width of 1-2 nm in order to have a silicon band gap, i.e., about 1.11 eV. However, it is not possible to cut the graphene to such a narrow nanoscale line width (less than 3 nm) by presently available semiconductor processing techniques. Accordingly, graphene semiconductor devices are not yet practically realized although there has been considerable interest in using graphene.

SUMMARY

Techniques for fabricating a nanoscale graphene structure are provided. In one embodiment, a method for fabricating a nanoscale graphene structure includes forming an oxide nanostructure on a grapheme layer; aligning the oxide nanostructure in a predetermined direction on the grapheme layer, performing anisotropic etching by using the aligned oxide nanostructure as a mask, and removing a remaining oxide nanostructure after the anisotropic etching.

In another embodiment, a method for fabricating a nanoscale graphene structure includes forming a metal layer on a grapheme layer, forming a molecule layer pattern having a hydrophobic molecule layer in a first region on the metal layer, aligning an oxide nanostructure in a second region on the metal layer where the hydrophobic molecule layer is not formed, performing anisotropic etching using the aligned oxide nanostructure as a mask, and removing a remaining oxide nanostructure and a remaining metal layer nanostructure after the anisotropic etching.

In yet another embodiment, a method for fabricating a nanoscale graphene structure includes forming a sacrificial layer on a grapheme layer, forming a metal layer on the sacrificial layer, forming a molecule layer pattern having a hydrophobic molecule layer in a first region on the metal layer, aligning an oxide nanostructure in a second region on the metal layer where the hydrophobic molecule layer is not formed, performing anisotropic etching using the aligned oxide nanostructure as a mask, and removing a remaining oxide nanostructure, a remaining metal layer nanostructure, and a sacrificial layer nanostructure after the anisotropic etching.

The Summary is provided to introduce a selection of concepts in a simplified form that are further described below in the Detailed Description. The Summary is not intended to identify key features or essential features of the claimed subject matter, nor is it intended to be used as an aid in determining the scope of the claimed subject matter.

DETAILED DESCRIPTION

In the following detailed description, certain example embodiments will be shown and described, with reference to the Figures, simply by way of illustration. As those skilled in the art will appreciate, the described embodiments may be modified in various different ways, all without departing from the spirit or scope of the disclosure.

In addition, unless explicitly described to the contrary, the word "comprise" and variations such as "comprises" or "comprising" will be understood to imply the inclusion of stated elements but not the exclusion of any other elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the following example embodiments, techniques for fabricating a graphene structure of a nanoscale line width using an oxide nanostructure as a mask are disclosed. In the following description, a nanowire is taken as an example of the nanostructure used as a mask. However, it should be understood that a nanostructure of various other shapes such as a circle, an ellipse, and the like may also be used.

An oxide nanowire having a covalent bond shows stronger bonding than a metal having a metallic bond, and shows a far lower etch-rate with respect to ion beam milling than a metal. Therefore, an oxide nanowire may be used as a mask in order to remove peripheral materials when an etching period is appropriately controlled.

Figure 1:
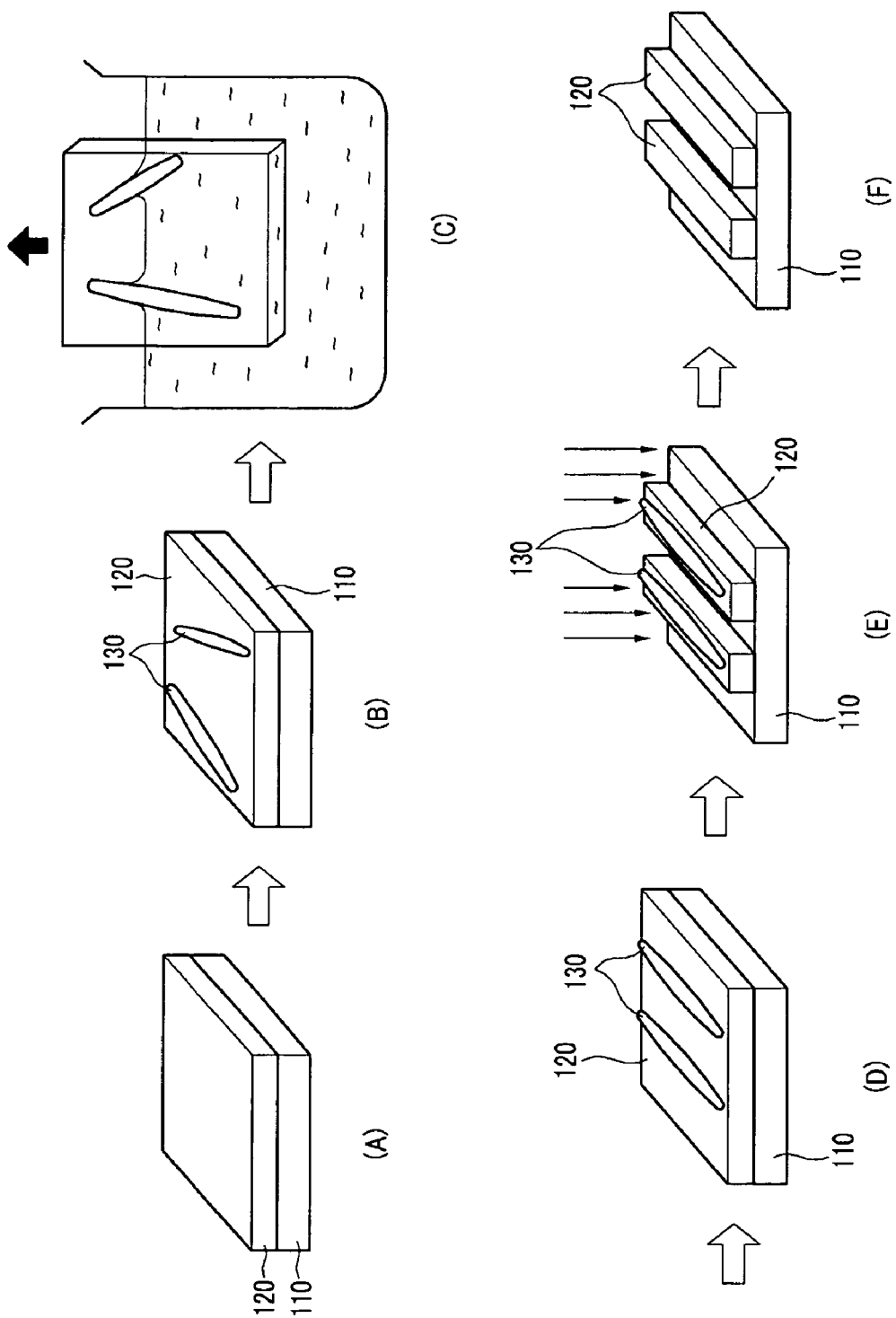
FIGS. 1A-1F illustrate a process of a method for fabricating a graphene structure according to a first example embodiment.

Hereinafter, a method for fabricating a graphene structure according to a first example embodiment is described in detail with reference to FIG. 1 and FIG. 2.

Figure 2:
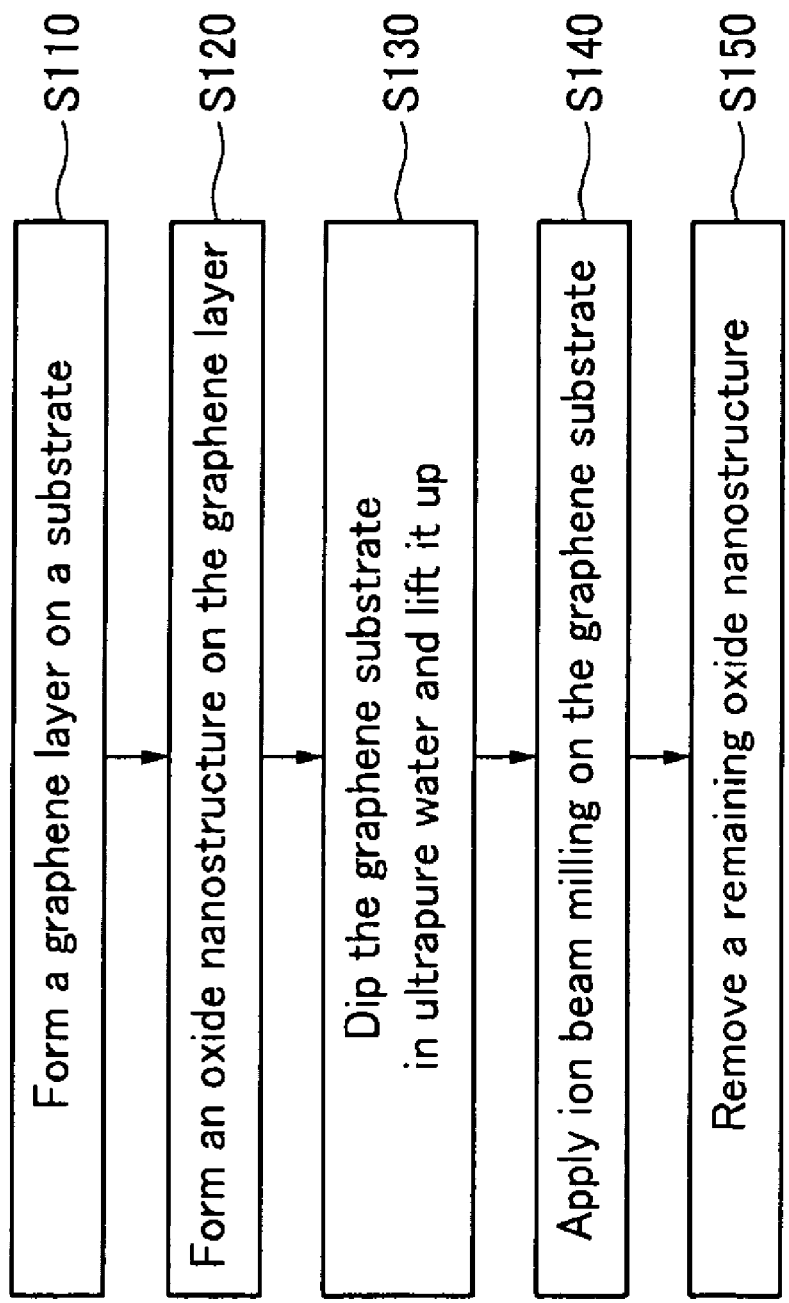
FIG. 2 is a flowchart that shows a method for fabricating a graphene structure according to the first example embodiment.

As shown in FIG. 1(A), a graphene layer 120 is formed on a substrate 110 (S110 in FIG. 2). In the present example embodiment, a silicon substrate is used as the substrate 110, but the substrate 110 is not limited thereto. A solid substrate of any other material appropriate for fabricating a device may be used as the substrate 110.

The graphene layer 120 may be formed on the substrate 110 through various methods, and one example technique is hereinafter described in detail.

Expandable graphite is processed in a gas chamber at 1000° C. and a 3% hydrogen ($H_2$) atmosphere, and is dispersed in dichloroethane by ultrasonic waves for about 30 minutes. Thereby a thin graphene is dispersed in a solution. When the substrate 110 is applied with the solution with the dispersed graphene and then rinsed, the graphene layer 120 is formed on the substrate 110.

Subsequently, as shown in FIG. 1(B), oxide nanowires 130 are formed on the graphene layer 120 (S120 in FIG. 2). In the present example embodiment, vanadium oxide (e.g., $V_2O_5$) nanowire is used as the oxide nanowires 130. The oxide nanowire 130 may be formed on the graphene layer 120 in various ways, and as one example, the vanadium oxide nanowire is formed on the graphene layer 120 as follows.

Induced electric dipoles may be easily formed at graphene on its surface, and such graphene formed with induced electric dipoles shows affinity to vanadium oxide nanowire having a negative charge. When a substrate applied with graphene (hereinafter called a "graphene substrate") is dipped in a vanadium oxide nanowire solution, nanowires adhere to a surface of a graphene layer. In this case, the affinity between the vanadium oxide nanowire and the substrate may be increased by applying a positive voltage to the graphene substrate. At this point, the oxide nanowires 130 are formed without directivity and are aligned in arbitrary directions.

As shown in FIG. 1(C), the graphene substrate applied with oxide nanowires 130 aligned in arbitrary directions is dipped in ultrapure water and then pulled out of the ultrapure water along a desired alignment direction (S130 in FIG. 2). The oxide nanowires 130 are thereby realigned on the graphene layer 120 along the pulling direction by surface tension as shown in FIG. 1(D).

Subsequently, as shown in FIG. 1(E), the graphene substrate with the realigned oxide nanowires 130 is placed in a focused ion beam (FIB) apparatus, and then an ion beam milling process is performed (S140 in FIG. 2). That is, an ion beam milling etching process, which is a type of anisotropic etching process, is performed using the nanowires 130 aligned on the graphene layer 120 as a mask.

An oxide nanowire having a covalent bond shows stronger bonding than graphene having a metallic bond, and shows a far lower etch-rate with respect to ion beam milling than graphene. Therefore, an oxide nanowire may be used as a mask in order to remove graphene at the periphery of the mask when an etching period is appropriately controlled.

That is, as shown in FIG. 1(E), when the ion beam etching is performed on the graphene pattern on which the oxide nanowires 130 are aligned, the graphene layer 120 under the nanowires 130 remains but the graphene layer 120 of other regions are removed since the nanowires 130 act as a mask.

After the ion beam etching, the substrate 110 is rinsed using a buffer solution (e.g., an aqueous solution of 1M NaCl) for about 10 minutes (S150 in FIG. 2). The result is that the oxide nanowires 130 are fully removed and only a graphene structure of the nanowire scheme remains as shown in FIG. 1(F).

In the first example embodiment, a vanadium oxide nanowire is taken as an example of the oxide nanowire 130 used as a mask since the vanadium oxide nanowire may be easily formed in a very narrow nanoscale size.

Other than the vanadium oxide, any material that has strong resistivity with respect to an ion beam may also be used. As an example, oxide materials such as vanadium pentoxide ($V_2O_5$) (other vanadium oxides VxOy may also be used), zinc oxide ($ZnO_5$), and silicon dioxide ($SiO_2$) typically show high resistivity with respect to an ion beam. This is partly because the bonding strength is high. Additionally, since the oxides are typically insulators, charges generated when exposed to the ion beam do not flow but are accumulated, and the accumulated charges may redirect the ion beam.

Figure 3:
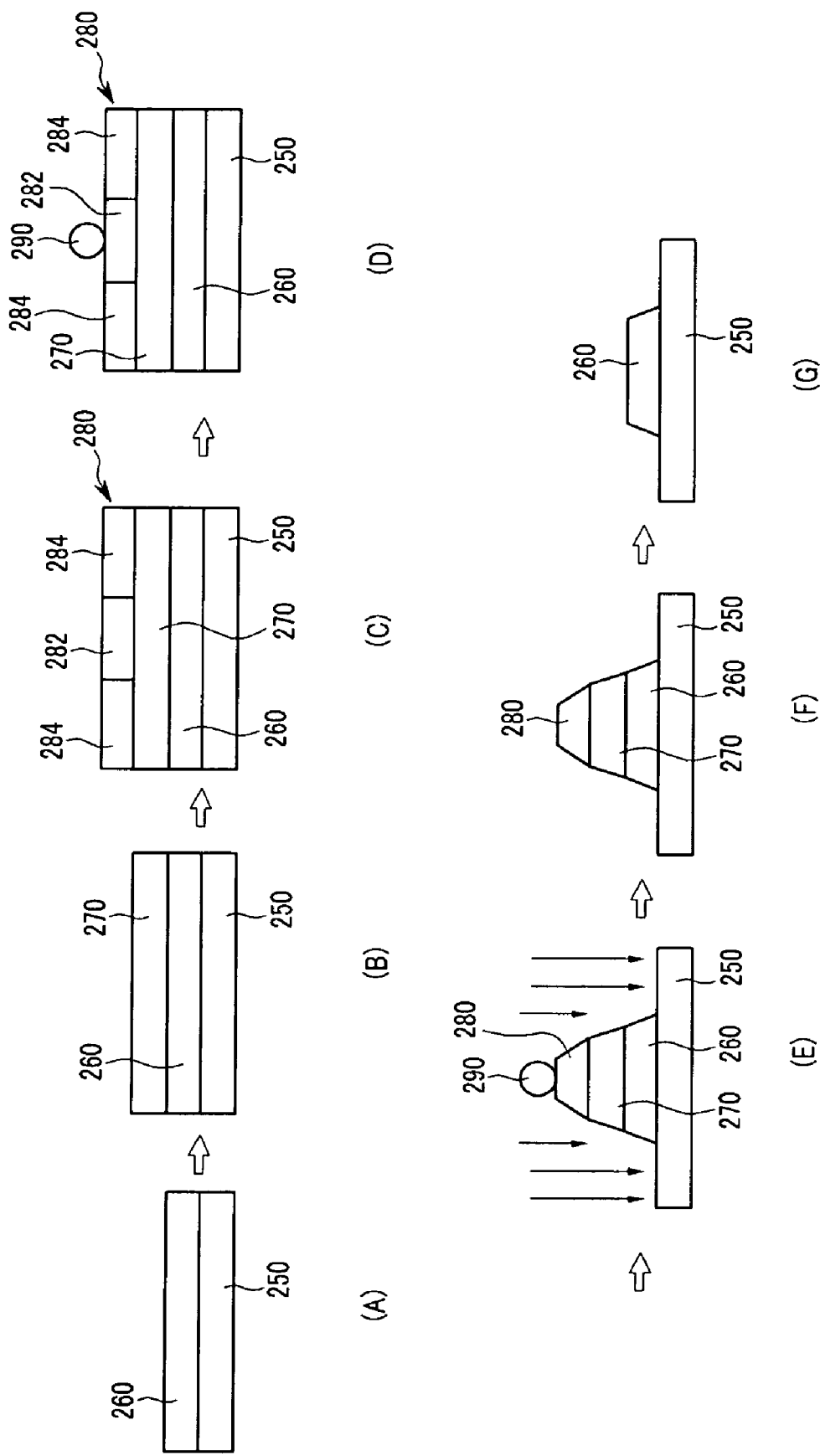
FIGS. 3A-3G illustrate a process of a method for fabricating a graphene structure according to a second example embodiment.

Hereinafter, a method for fabricating a nanoscale graphene structure according to a second example embodiment is described with reference to FIG. 3 and FIG. 4. In this second example embodiment, an oxide nanowire is placed at a specific position and direction on a molecule layer pattern, instead of aligning the oxide nanowires using surface tension as was described above with reference to FIG. 1(C).

Nanowires having an oxide surface are not assembled with a hydrophobic molecule layer but are assembled with a hydrophilic molecule layer or a solid surface that is charged with opposite polarity with respect to the oxides.

A method for fabricating a nanoscale graphene structure described hereinafter employs a technique for forming an oxide nanowire at a specific position and direction on a hydrophilic molecule layer utilizing the selective assembling characteristic, which is hereinafter referred to as a selective assembly method.

Figure 4:
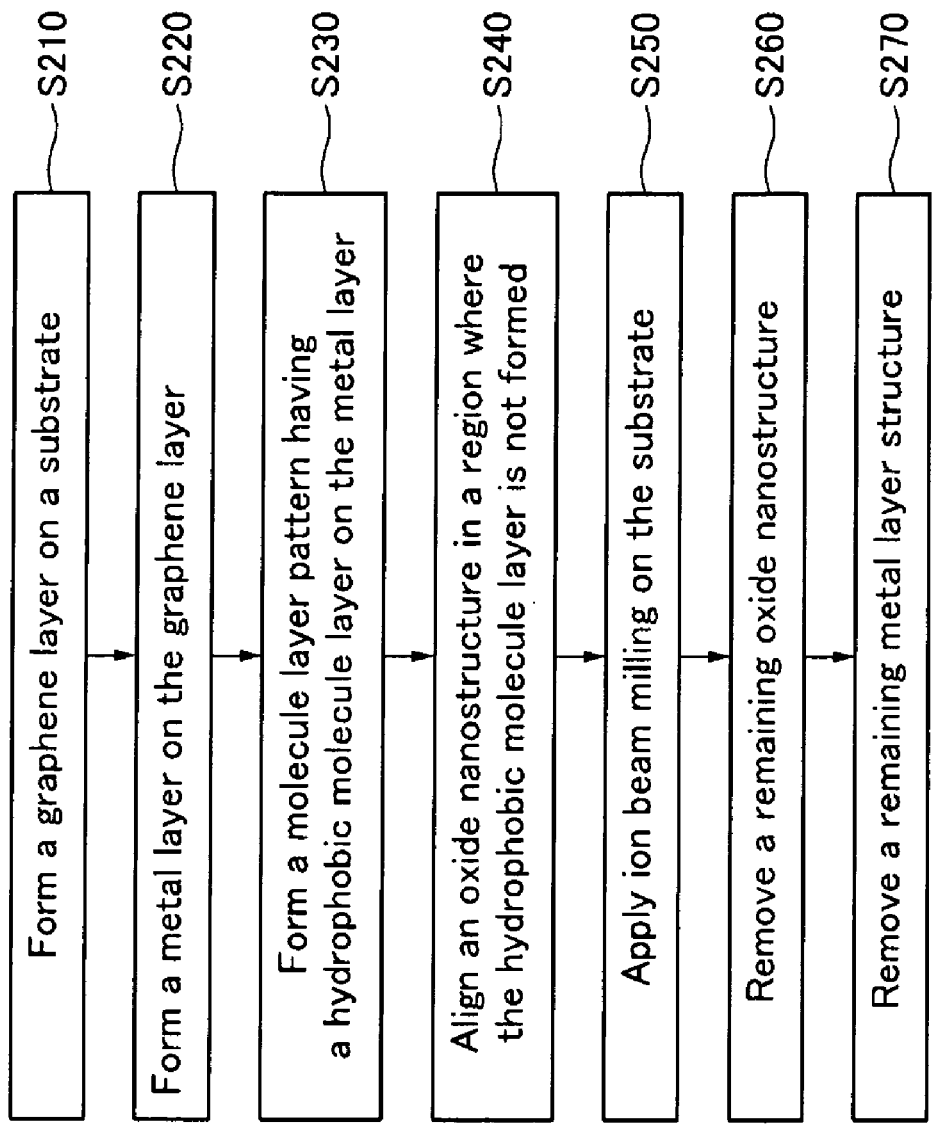
FIG. 4 is a flowchart that shows a method for fabricating a graphene structure according to the second example embodiment.

As shown in FIG. 3(A), a graphene layer 260 is formed on a substrate 250 (S210 in FIG. 4). The graphene layer 260 may be formed on the substrate 250 by various methods, as has been mentioned in the description of the first exemplary embodiment.

Subsequently, as shown in FIG. 3(B), a metal layer 270 is deposited on a surface of the graphene layer 260 by using a thermal evaporator or a sputter (S220 in FIG. 4). In the present example embodiment, gold is used for the metal layer 270, but other metals may also be used.

Subsequently, as shown in FIG. 3(C), a molecule layer pattern 280 including a hydrophobic molecule layer pattern 284 and a hydrophilic molecule layer pattern 282 that are charged with positive charges is formed on the metal layer 270 (S230 in FIG. 4).

In subsequent processes, the hydrophobic molecule layer 284 prevents absorption of oxide nanowires, and the hydrophilic molecule layer 282 helps the absorption of the oxide nanowires by increasing affinity thereto. Although the oxide nanowire may be formed without forming the hydrophilic molecule layer 282, according to the second example embodiment, by applying a positive voltage to the metal layer 270 after forming the hydrophilic molecule layer 282, the absorption of the oxide nanowires on the hydrophilic molecule layer 282 is facilitated.

The molecule layer pattern 280 may be formed using various techniques such as, by way of example, microcontact printing, photolithography, and dip-pen nanolithography (DPN). Since vanadium oxide nanowires having negative charges are used as oxide nanowires in the second example embodiment, a material such as octadecanethiol (ODT) is patterned as a hydrophobic molecule layer 284 on the metal layer 270, and a material such as cysteamin is patterned as the hydrophilic molecule layer 282.

Subsequently, as shown in FIG. 3(D), the substrate 250 patterned with the molecule layer is dipped in a vanadium oxide nanowire solution, and vanadium oxide nanowires 290 are selectively assembled with the hydrophilic molecule layer 282 that is positively charged (S240 in FIG. 4). In this case, the vanadium oxide nanowires 290 may be aligned at a resolution of nanometer scale.

Subsequently, as shown in FIG. 3(E), an ion beam milling is applied on the substrate 250 on which the vanadium oxide nanowires 290 are aligned (S250 in FIG. 4). As a result of the ion beam milling, the molecule layer pattern 280, the metal layer 270, and the graphene layer 260 are removed, but the vanadium oxides 290 remain. That is, the vanadium oxide nanowires 290 act as a mask, and accordingly, the metal layer 270 and graphene layer 260 under the vanadium oxide nanowires 290 remains after the ion beam exposure.

Hereinafter, the metal layer structure under the vanadium oxide nanowires 290 that remains after the ion beam etching is referred to as "metal nanowires."

Subsequently, as shown in FIG. 3(F), the substrate 250 is rinsed using a buffer solution (e.g., an aqueous solution of 1M NaCl) for about 10 minutes (S260 in FIG. 4) after the ion beam exposure, so that the vanadium oxide nanowires 290 are fully removed and only metal nanowires and the graphene nanostructure remain.

Finally, as shown in FIG. 3(G), the metal nanowires are removed from the substrate 250 by a metal etching solution (S270 in FIG. 4), and only the graphene nanostructure remains on the substrate 250. In this second example embodiment, a mixed solution of nitric acid and hydrochloric acid may be used as the metal etching solution. The molecule layer above the metal nanowire is also removed when the metal nanowires are removed.

In the second example embodiment, the vanadium oxide nanowires 290 used as a mask of the ion beam etching are aligned on the metal layer 270 as shown in FIG. 3(D). The metal layer 270 is formed prior to the vanadium oxide nanowires 290 since it may be difficult to align the vanadium oxide nanowires 290 directly on the graphene layer 260 by using a selective assembly process.

Figure 5:
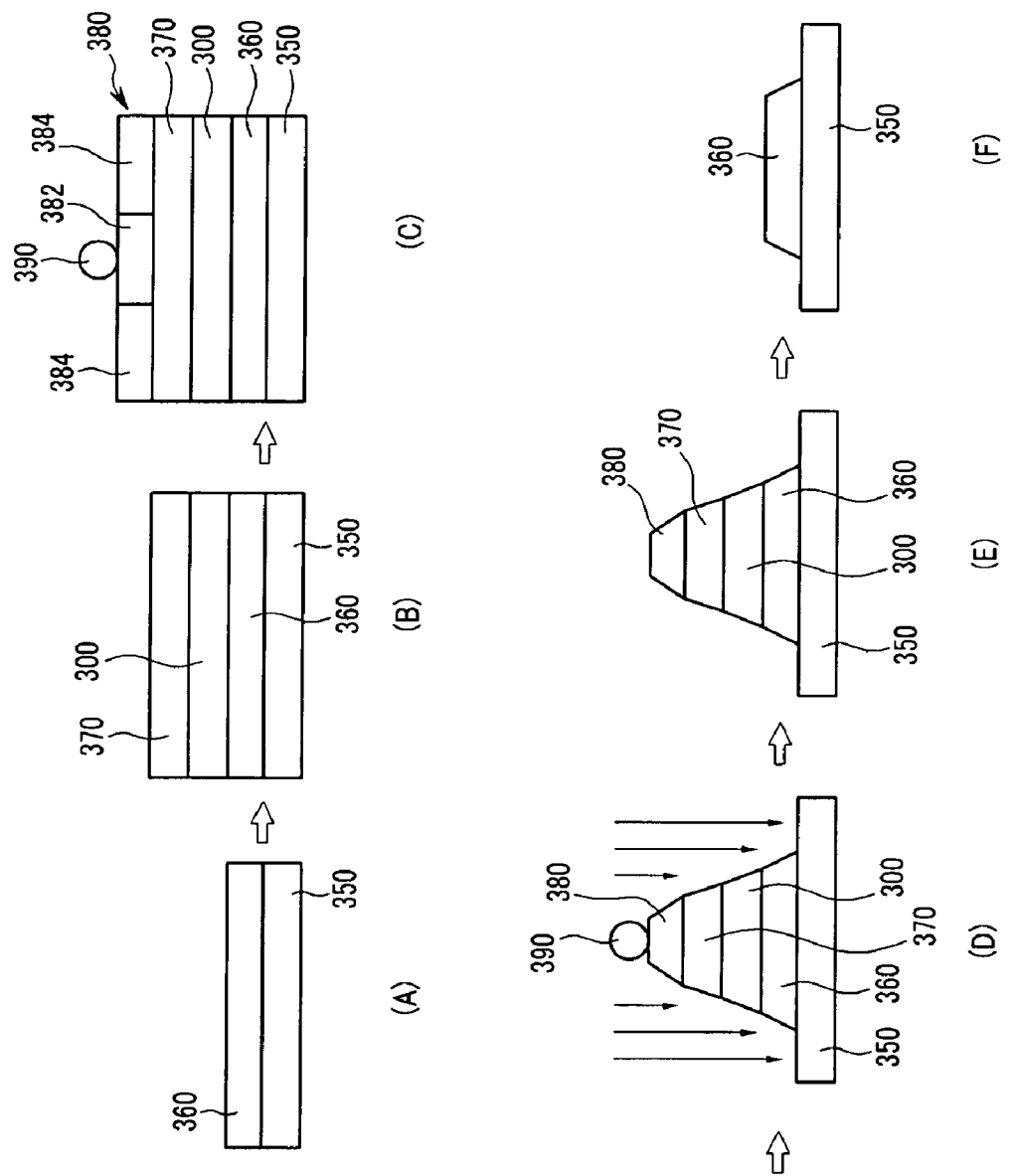
FIGS. 5A-5F illustrate a process of a method for fabricating a graphene structure according to a third example embodiment.

Hereinafter, a method for fabricating a nanoscale graphene structure according to a third example embodiment is described with reference to FIG. 5 and FIG. 6. Similar to as described above in the second example embodiment, oxide nanowires are formed by using a selective assembly process in the third example embodiment. However, different from the second example embodiment, a process of depositing a sacrificial layer is added prior to depositing a metal layer on a graphene layer. In the description below, processes that are substantially the same as described in the second example embodiment are described in an abbreviated manner for convenience of description and better understanding.

Figure 6:
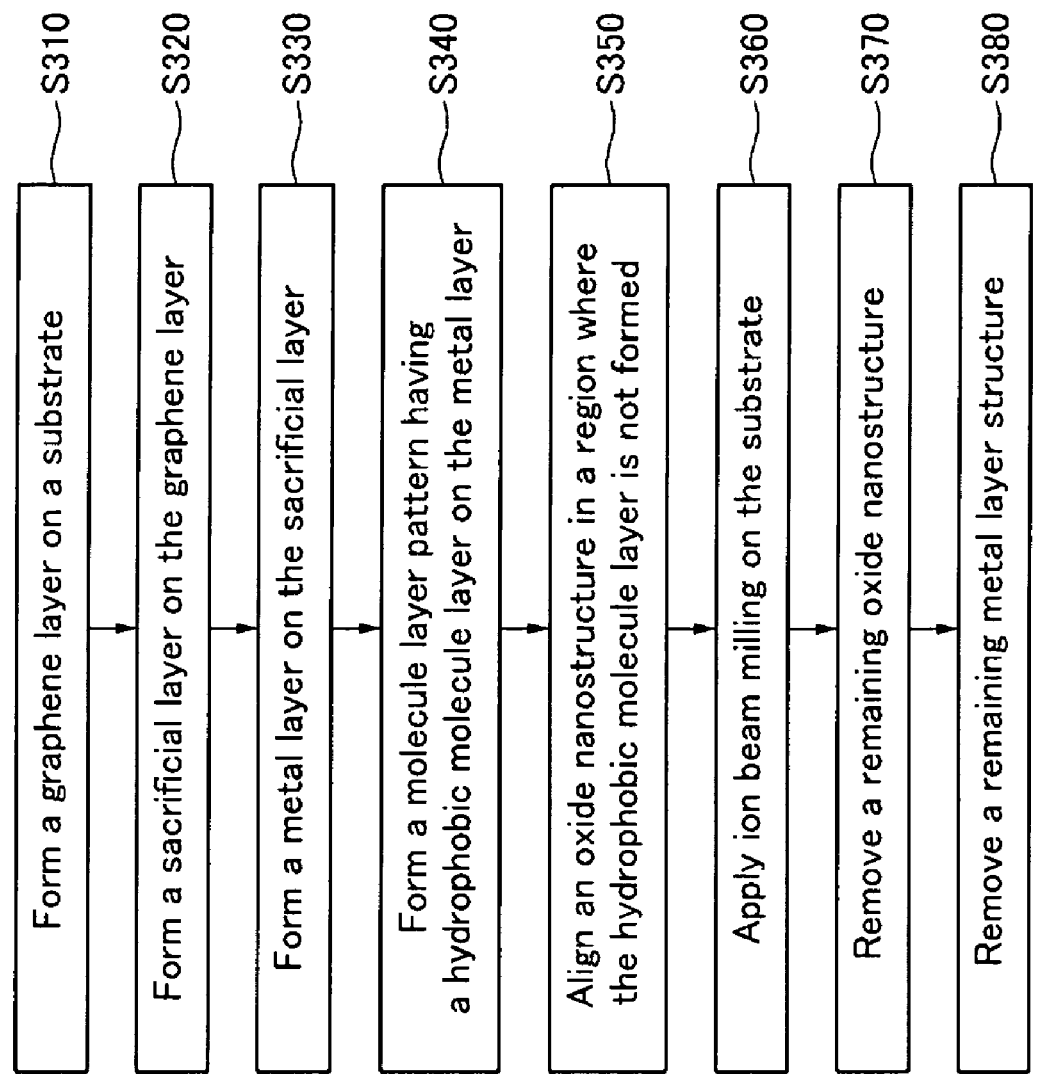
FIG. 6 is a flowchart that shows a method for fabricating a graphene structure according to the third example embodiment.

As shown in FIG. 5(A), a graphene layer 360 is formed on a substrate 350 (S310 in FIG. 6). Subsequently, as shown in FIG. 5(B), a sacrificial layer 300 is deposited on a surface of the graphene layer 360 by using a thermal evaporator or a sputter (S320 in FIG. 6). In this third example embodiment, aluminum may be used for the sacrificial layer 300. Aluminum shows a relatively high ionization tendency, and thus it is easily removed since it is easily oxidated and etched. A material other than aluminum may also be used for the sacrificial layer 300 as long as the material is oxidated and etched easier than a metal layer that is subsequently formed.

Subsequently, as shown in FIG. 5(C), a metal layer 370 is deposited on the sacrificial layer 300 (S330 in FIG. 6), and then a molecule layer pattern 380 including a hydrophobic molecule layer pattern 384 and a hydrophilic molecule layer pattern 382 charged with positive charges is formed on the metal layer 370 (S340 in FIG. 6). In this third example embodiment, gold (Au) may be used for the metal layer 370.

Subsequently, as shown in FIG. 5(C), vanadium oxide nanowires 390 are aligned on the substrate 350 patterned with the molecule layer, by a selective assembly process (S350 in FIG. 6).

Subsequently, as shown in FIG. 5(D), the molecule layer pattern 380, the metal layer 370, the sacrificial layer 300, and the graphene layer 360 are removed in a region that is not covered with the vanadium oxide nanowires 390, by applying the ion beam to the substrate 350 on which the vanadium nanowires 390 are aligned (S360 in FIG. 6).

Subsequently, the vanadium oxide nanowires 390 are removed from the substrate 350 by using a buffer solution (e.g., an aqueous solution of 1M NaCl) (S370 in FIG. 6) after the ion beam exposure, and then the sacrificial layer 300 is fully removed as shown in FIG. 5(F) (S380 in FIG. 6).

In the third example embodiment, instead of removing the metal layer 370 by a metal etching solution, the sacrificial layer 300 of aluminum is etched by dipping the substrate 350 in a tetramethylammonium hydroxide (TMAH) solution so that the metal layer 370 and the molecule layer pattern 380 formed on the sacrificial layer 300 may be removed by separation. In contrast to the second example embodiment, the sacrificial layer 300 is removed using a TMAH solution that is alkaline in this third exemplary embodiment, instead of removing the metal layer 370 using a metal etching solution that is strongly acidic. Therefore, a graphene nanostructure may be formed without causing damage to the graphene.

The present disclosure may be embodied in other specific forms without departing from its basic features or characteristics. Thus, the described embodiments are to be considered in all respects only as illustrative, and not restrictive. The scope of the disclosure is, therefore, indicated by the appended claims, rather than by the foregoing description. All changes within the meaning and range of equivalency of the claims are to be embraced within their scope.

What is claimed is:

1. A method for fabricating a graphene nanostructure, comprising:
   forming an oxide nanostructure on a graphene layer;
   aligning the oxide nanostructure on the graphene layer;
   performing anisotropic etching of the graphene layer by using the aligned oxide nanostructure as a mask; and
   removing a remaining oxide nanostructure after the anisotropic etching.

2. The method of claim 1, wherein the graphene layer is formed on a substrate.

3. The method of claim 2, wherein the substrate formed with the graphene layer is dipped in a solution including the oxide nanostructure so that the oxide nanostructure of the solution is formed on the graphene layer.

4. The method of claim 3, wherein the oxide nanostructure is formed on the graphene layer in an arbitrary direction.

5. The method of claim 4, wherein the oxide nanostructure is aligned on the graphene layer by dipping the graphene layer formed with the oxide nanostructure in ultrapure water and then pulling the graphene layer out of the ultrapure water along a predetermined direction.

6. The method of claim 2, wherein the anisotropic etching is ion beam etching performed using the aligned oxide nanostructure as a mask.

7. The method of claim 1, wherein the oxide nanostructure comprises a vanadium oxide nanowire.

8. A method for fabricating a graphene nanostructure, comprising:
   forming a metal layer on a graphene layer;
   forming a molecule layer pattern having a hydrophobic molecule layer in a first region on the metal layer;
   aligning an oxide nanostructure in a second region on the metal layer where the hydrophobic molecule layer is not formed;
   performing anisotropic etching of the graphene layer using the aligned oxide nanostructure as a mask; and
   removing a remaining oxide nanostructure and a remaining metal layer nanostructure after the anisotropic etching.

9. The method of claim 8, wherein the graphene layer is formed on a substrate.

10. The method of claim 9, further comprising removing the metal layer nanostructure by a metal etching solution after removing the oxide nanostructure by using a buffer solution.

11. The method of claim 9, wherein a hydrophilic molecule layer is formed in the second region on the metal layer.

12. The method of claim 11, wherein the metal layer is formed of gold (Au).

13. The method of claim 12, wherein the hydrophobic molecule layer comprises octadecanethiol.

14. The method of claim 12, wherein the hydrophilic molecule layer comprises cysteamin.

15. The method of claim 9, wherein the anisotropic etching is ion beam etching performed using the aligned oxide nanostructure as a mask.

16. The method of claim 8, wherein the oxide nanostructure comprises a vanadium oxide nanowire.

17. A method for fabricating graphene nanostructure, comprising:
    forming a sacrificial layer on a graphene layer;
    forming a metal layer on the sacrificial layer;
    forming a molecule layer pattern having a hydrophobic molecule layer in a first region on the metal layer;
    aligning an oxide nanostructure in a second region on the metal layer where the hydrophobic molecule layer is not formed;
    performing anisotropic etching of the graphene layer using the aligned oxide nanostructure as a mask; and
    removing a remaining oxide nanostructure, a remaining metal layer nanostructure, and a sacrificial layer nanostructure after the anisotropic etching.

18. The method of claim 17, wherein the graphene layer is formed on a substrate.

19. The method of claim 18, further comprising removing the sacrificial layer nanostructure after removing the oxide nanostructure by using a buffer solution.

20. The method of claim 19, wherein the metal layer is formed of gold, and the sacrificial layer is formed of aluminum.

21. The method of claim 20, wherein the sacrificial layer nanostructure is removed by using a tetramethylammonium hydroxide solution.

22. The method of claim 18, wherein a hydrophilic molecule layer is formed in the second region on the metal layer.

23. The method of claim 18, wherein the anisotropic etching is ion beam etching performed using the aligned oxide nanostructure as a mask.

24. The method of claim 17, wherein the oxide nanostructure comprises a vanadium oxide nanowire.

25. The method of claim 2 wherein aligning the oxide nanostructure comprises aligning the oxide nanostructure in a direction parallel to the substrate.

* * * * *